(12) United States Patent
Wentzloff et al.

(10) Patent No.: US 9,681,389 B2
(45) Date of Patent: Jun. 13, 2017

(54) INTEGRATED ULTRA WIDEBAND TRANSCEIVER

(71) Applicant: The Regents of The University of Michigan, Ann Arbor, MI (US)

(72) Inventors: David D. Wentzloff, Ann Arbor, MI (US); Jonathan K. Brown, Brookline, MA (US); Kuo-Ken Huang, Ann Arbor, MI (US); Elnaz Ansari, Ann Arbor, MI (US); Ryan R. Rogel, Austin, TX (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/768,143

(22) PCT Filed: Feb. 17, 2014

(86) PCT No.: PCT/US2014/016713
§ 371 (c)(1),
(2) Date: Aug. 14, 2015

(87) PCT Pub. No.: WO2014/127324
PCT Pub. Date: Aug. 21, 2014

(65) Prior Publication Data
US 2015/0382296 A1 Dec. 31, 2015

Related U.S. Application Data

(60) Provisional application No. 61/765,377, filed on Feb. 15, 2013.

(51) Int. Cl.
*H04W 52/02* (2009.01)
*H04B 1/7163* (2011.01)
(Continued)

(52) U.S. Cl.
CPC ........ *H04W 52/029* (2013.01); *H03K 3/0231* (2013.01); *H03K 5/24* (2013.01);
(Continued)

(58) Field of Classification Search
CPC ..... H04W 52/029; H04B 1/7183; H04B 1/40; H04B 1/71635; H04B 1/71637; H03K 3/0231; H03K 5/24
See application file for complete search history.

(56) References Cited

U.S. PATENT DOCUMENTS 6,504,433 B1  1/2003  Weber et al.
6,967,877 B2 *  11/2005  Chou .................... G11C 11/406
                                                              365/189.09

(Continued)

FOREIGN PATENT DOCUMENTS

JP        2012239189 A     12/2012

OTHER PUBLICATIONS

Y. Shamsa, "LC Ladder Based Orthonormal Filter for Impulse-Radio UWB PulseGeneration", Msc Thesis electrical engineering, Delft University of Technology, 2009, pp. 1-93.
(Continued)

*Primary Examiner* — Syed Haider
(74) *Attorney, Agent, or Firm* — Reising Ethington P.C.

(57) ABSTRACT

An integrated ultra wideband transceiver. The transceiver comprises a transmitter, a receiver, and at least one on-chip monopole antenna electrically connected to at least one of the transmitter or receiver for transmitting and/or receiving electrical signals. The transceiver further comprises a clock generator comprising a temperature-compensated relaxation oscillator, a baseband controller electrically connected to, and configured to exert a measure of control over, at least one the transmitter, receiver, or clock generator, and a micro-battery operative to provide operating power to each
(Continued)

of the transmitter, receiver, clock generator, and baseband controller.

26 Claims, 16 Drawing Sheets

(51) Int. Cl.
   *H03K 3/0231* (2006.01)
   *H03K 5/24* (2006.01)
   *H04B 1/40* (2015.01)
   *H04B 1/7183* (2011.01)
(52) U.S. Cl.
   CPC ............ *H04B 1/40* (2013.01); *H04B 1/7183* (2013.01); *H04B 1/71635* (2013.01); *H04B 1/71637* (2013.01)

(56) References Cited

U.S. PATENT DOCUMENTS

| | | | | |
|---|---|---|---|---|
| 6,975,665 B1* | 12/2005 | McCorkle | ............ | H04B 1/7163 375/130 |
| 2003/0146809 A1* | 8/2003 | Buber | ............ | H01L 24/49 333/172 |
| 2004/0223535 A1* | 11/2004 | You | ............ | H04B 1/719 375/130 |
| 2005/0105595 A1* | 5/2005 | Martin | ............ | H04B 1/707 375/140 |
| 2005/0175076 A1* | 8/2005 | Miller | ............ | G01S 7/023 375/150 |
| 2006/0240798 A1* | 10/2006 | Jarosinski | ............ | H04B 1/1615 455/343.1 |
| 2007/0297812 A1* | 12/2007 | Takeuchi | ............ | H03K 3/0377 398/202 |
| 2009/0021332 A1* | 1/2009 | Brekelmans | ............ | H01L 27/0629 334/55 |
| 2010/0062730 A1* | 3/2010 | Yoon | ............ | H01Q 1/2216 455/90.2 |
| 2010/0135195 A1* | 6/2010 | Sakoda | ............ | H04W 76/048 370/311 |
| 2010/0244976 A1* | 9/2010 | Kerr | ............ | H03K 7/06 332/144 |
| 2011/0012692 A1* | 1/2011 | Mirzaei | ............ | H03H 1/02 333/172 |
| 2012/0056002 A1 | 3/2012 | Ritamaki et al. | | |
| 2012/0063186 A1* | 3/2012 | Tsui | ............ | H02M 5/2576 363/126 |
| 2012/0270500 A1 | 10/2012 | Maugars et al. | | |
| 2012/0297210 A1* | 11/2012 | Yu | ............ | G06F 1/26 713/300 |
| 2013/0049711 A1* | 2/2013 | Mirea | ............ | H02M 3/1563 323/234 |
| 2014/0205106 A1* | 7/2014 | Linn | ............ | H04R 3/02 381/71.2 |
| 2014/0220910 A1* | 8/2014 | Jia | ............ | H03G 3/3042 455/78 |
| 2014/0233669 A1* | 8/2014 | Aggarwal | ............ | H04L 25/03 375/285 |

OTHER PUBLICATIONS

International Search Report for application No. PCT/US2014/016713, dated May 29, 2014, 3 pages.

* cited by examiner

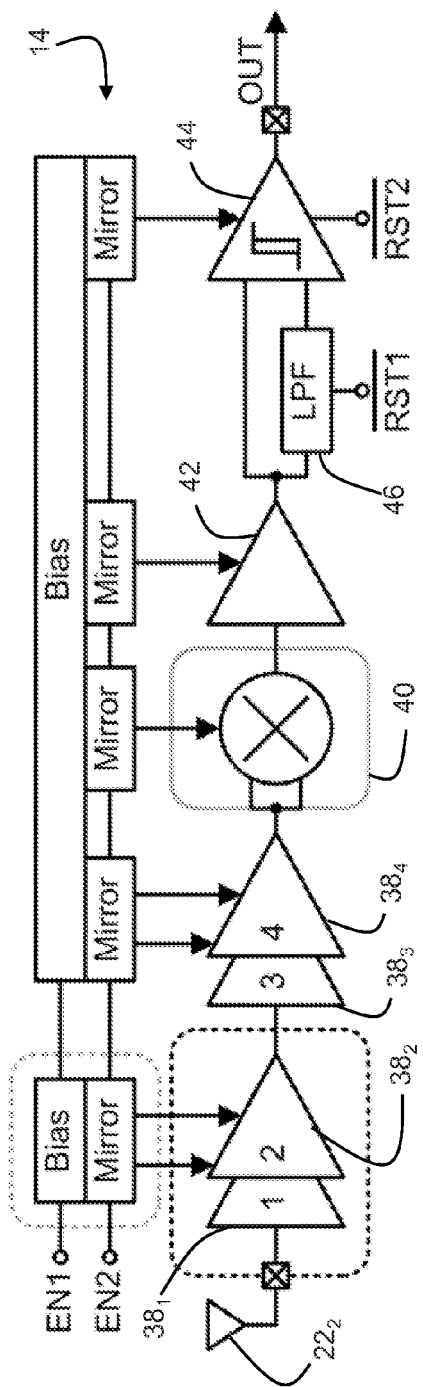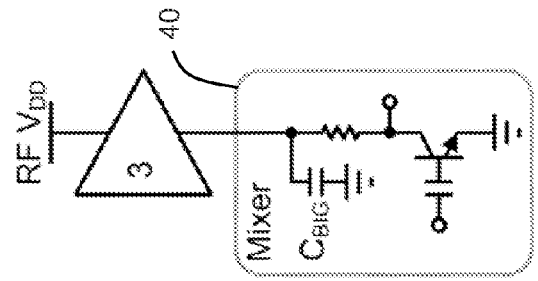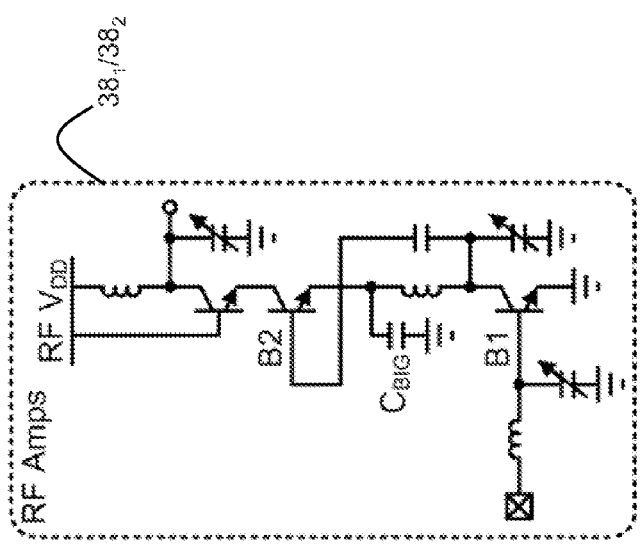
*Figure 3a*
*Figure 3c*
*Figure 3d*

| | | |
|---|---|---|
| General | Process | 0.18μm BiCMOS |
| | Modulation | PPM |
| | Total Area | 2.73mm² |
| | Data Rate | 30kb/s |
| | RF Voltage | 3.2-4.1V |
| | Baseband Voltage | 1.2V |
| | Sleep Power | 1.0nW @3.6V / 1.8nW @1.2V |
| Baseband System | Active Power | 269μW @3MHz |
| | Clock | 13μW @3MHz |
| | I2C & Sleep Ctrl | 10μW |
| | Baseband Ctrl | 246μW @3MHz |
| | Area | 0.97mm² |
| | Clock | 0.04mm² |
| | I2C & Sleep Ctrl | 0.18mm² |
| | Baseband Ctrl | 0.75mm² |
| Clock | Frequency | 3MHz |
| | Supply Sensitivity | ±1.5% @±4% $V_{DD}$ |
| | Temp Sensitivity | ±1.0% @0 to 50°C |
| | Temp Coefficient | -584ppm/°C |
| Receiver | Average Power | 37μW @3.6V |
| | Sleep Power | 347pW @3.6V |
| | Center Frequency | 9.7-10.2GHz |
| | Area | 0.61mm² |
| | Sensitivity | -67dBm @$10^{-3}$ BER |
| Transmitter | Average Power | 22.4μW @3.6V |
| | Sleep Power | 170pW @3.6V |
| | Center Frequency | 9-12GHz |
| | Area | 0.11mm² |
| | Output Power | 0.9dBm |
| | Pulse Width | 1.2-6.0ns |
| Current Limiter | Active Power | 223nW @3.6V |
| | Sleep Power | 550pW @3.6V |
| | Area | 0.04mm² |
| | Output Current | 6-38μA |
| | Temp Sensitivity | -34nA/°C |
| | Line Sensitivity | 0.21μA/°C |
| | Efficiency | 94% @3.6V |

*Figure 7*

INTEGRATED ULTRA WIDEBAND TRANSCEIVER

GOVERNMENT LICENSE RIGHTS

This invention was made with government support under CNS-1111541 and CNS-1035303 awarded by the National Science Foundation. The Government has certain rights in the invention.

TECHNICAL FIELD

The present disclosure relates generally to ultra wideband transceivers, and more particularly, to integrated ultra-low-power ultra wideband transceivers.

BACKGROUND

It is a reality that biomedical and "internet-of-things" applications, among others, are driving the volume of wireless sensors, and therefore, ultra wideband transceivers associated therewith, into the cubic-mm regime. At the mm-scale, complete integration of such sensor transceivers is necessary, and their operation within the limits of a micro-battery used to power the components of such sensor transceivers becomes a challenge. With CMOS scaling and ultra-low-power circuits allowing for a reduction in battery volume, the antenna and crystal, which is used to perform clocking functions, of such sensor transceivers quickly become the largest components in a cubic-mm sensor node.

SUMMARY

According to one embodiment, an integrated ultra wideband transceiver comprises a transmitter, a receiver, and a clock generator comprising a relaxation oscillator. The transceiver further comprises a baseband controller electrically connected to, and configured to exert a measure of control over, at least one of the transmitter, receiver, and clock generator; and a micro-battery operative to provide operating power to each of the transmitter, receiver, clock generator, and baseband controller.

In accordance with another embodiment, an integrated ultra wideband transceiver comprises a transmitter, a receiver, and at least one on-chip monopole antenna electrically connected to at least one of the transmitter or receiver for transmitting and/or receiving electrical signals. The transceiver further comprises a clock generator comprising a temperature-compensated relaxation oscillator; a baseband controller electrically connected to, and configured to exert a measure of control over, at least one of the transmitter, receiver, or clock generator; and a micro-battery operative to provide operating power to each of the transmitter, receiver, clock generator, and baseband controller.

In accordance with another embodiment, an RC network comprises first resistor and a series combination of a capacitor and a second resistor, wherein the first resistor is electrically connected in circuit with the series combination of the capacitor and the second resistor.

In accordance with another embodiment, an integrated ultra wideband transceiver comprises a transmitter, a receiver, a first on-chip monopole antenna electrically connected to the transmitter for transmitting electrical signals, and a second on-chip monopole antenna electrically connected to the receiver for receiving electrical signals. The transceiver further comprises a clock generator comprising a temperature-compensated relaxation oscillator, and a baseband controller electrically connected to, and configured to exert a measure of control over, at least one of the transmitter, receiver, or clock generator. The transceiver still further comprises a micro-battery operative to provide operating power to each of the transmitter, receiver, clock generator, and baseband controller; a current limiter electrically connected between the micro-battery and at least one of the transmitter, receiver, clock generator, or baseband controller; and a storage capacitor electrically connected to the current limiter and the at least one of the transmitter, receiver, clock generator, or baseband controller.

BRIEF DESCRIPTION OF THE DRAWINGS

Preferred exemplary embodiments will hereinafter be described in conjunction with the appended drawings, wherein like designations denote like elements, and wherein:

FIGS. 3a-3d are diagrammatic and schematic views of illustrative embodiments of a receiver and various components thereof of the ultra wideband transceiver illustrated in FIG. 1;

FIG. 7 comprises a series of tables containing performance information of various components of an illustrative implementation of the transceiver illustrated in FIG. 1;

DETAILED DESCRIPTION OF THE ILLUSTRATED EMBODIMENTS

Described below are embodiments of an integrated ultra wideband transceiver. As used herein, the term "integrated" is intended to mean that the components of the transceiver are disposed on a single chip to form a "system-on-a-chip." As will be described in greater detail below, in an embodiment, the transceiver is an impulse-radio ultra wideband (IR-UWB) transceiver having one or more on-chip monopole antennas, while in another embodiment, the transceiver may include the option of wire-bonding to an off-chip antenna. In accordance with an illustrative implementation, the transceiver is a 9.8 GHz transceiver that includes, for example, a corresponding 2 mm monopole antenna for each of the transmitter and receiver of the device. Further, rather than comprising a crystal for performing a clocking function as is conventional in many known transceiver devices, the transceiver comprises a clock generator in the form of relaxation oscillator, which, in an embodiment, may comprise a temperature-compensated relaxation oscillator. Due to modern mm-scale battery limitations, it may be desirable, in certain embodiments, to limit the peak current draw of the transceiver to <100 μA, which is far below typical power consumption of such transceivers. Furthermore, because external capacitors may be too large for mm-scale sensor nodes, duty-cycling only at the packet level may not be an option. Accordingly, in certain embodiments, the transceiver may include current limiting at the battery supply; while an integrated baseband controller or modem of the transceiver may duty-cycle the RF-front-end at the bit-level in order to operate it off integrated storage capacitance. Finally, while many conventional or known transceivers operate at <1V, in an embodiment, voltage of a micro-battery may be on the order of 3.2~4.1V, and integrated conversion efficiency may be <80%. Thus, transceiver of the present disclosure is designed to operate various components or blocks thereof over the entire voltage range of the battery of the transceiver.

Figure 1:
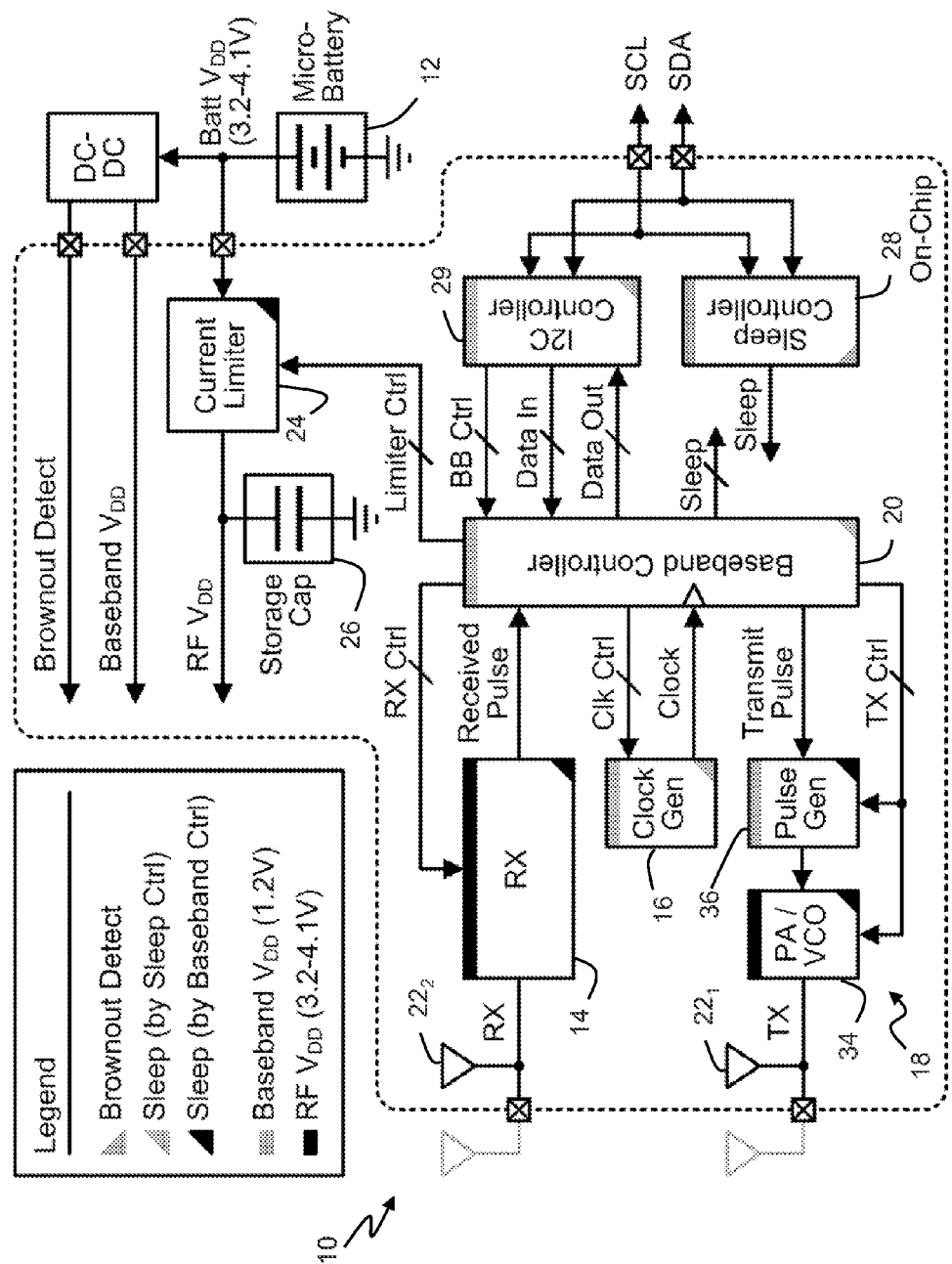
FIG. 1 is a diagrammatic and schematic view of an illustrative embodiment of an integrated ultra wideband transceiver.

Referring now to the drawings, FIG. 1 is a diagrammatic and schematic view of an illustrative embodiment of an integrated ultra wideband transceiver 10 (referred to below simply as "transceiver 10"). In the illustrated embodiment, the transceiver 10 generally comprises a micro-battery 12, a receiver (RX) 14, a clock generator (Clock Gen) 16, a transmitter (TX) 18, and a baseband controller 20. In an embodiment, the transceiver 10 further comprises one or more integrated (i.e., on-chip) antennas 22 (e.g., antennas $22_1$, $22_2$) electrically connected to the transmitter 18 and/or receiver 14. Alternatively, each of the transmitter 18 and receiver 14 may be configured to be electrically connected to one or more off-chip antennas. In addition to the above, the transceiver 10 may further comprise a number of other components such as, for example and without limitation, one or more of a current limiter 24, a storage capacitor 26 (e.g., an on-chip storage capacitor), and/or a sleep controller 28, each of which will be described in greater detail below. In an embodiment, the transceiver 10 further comprise a controller 29, for example, an I²C controller, that is configured to provide or facilitate bidirectional communication, for example, with other dies stacked in a sensor node (e.g., between the baseband controllers 20 thereof). As will be appreciated by those having ordinary skill in the art, the controller 29 may comprise any variety of electronic processing device(s), memory device(s), input/output (I/O) device(s), and/or other components (e.g., software, firmware, and middleware) required to carry out the functionality of the controller 29 described herein.

Figure 2:
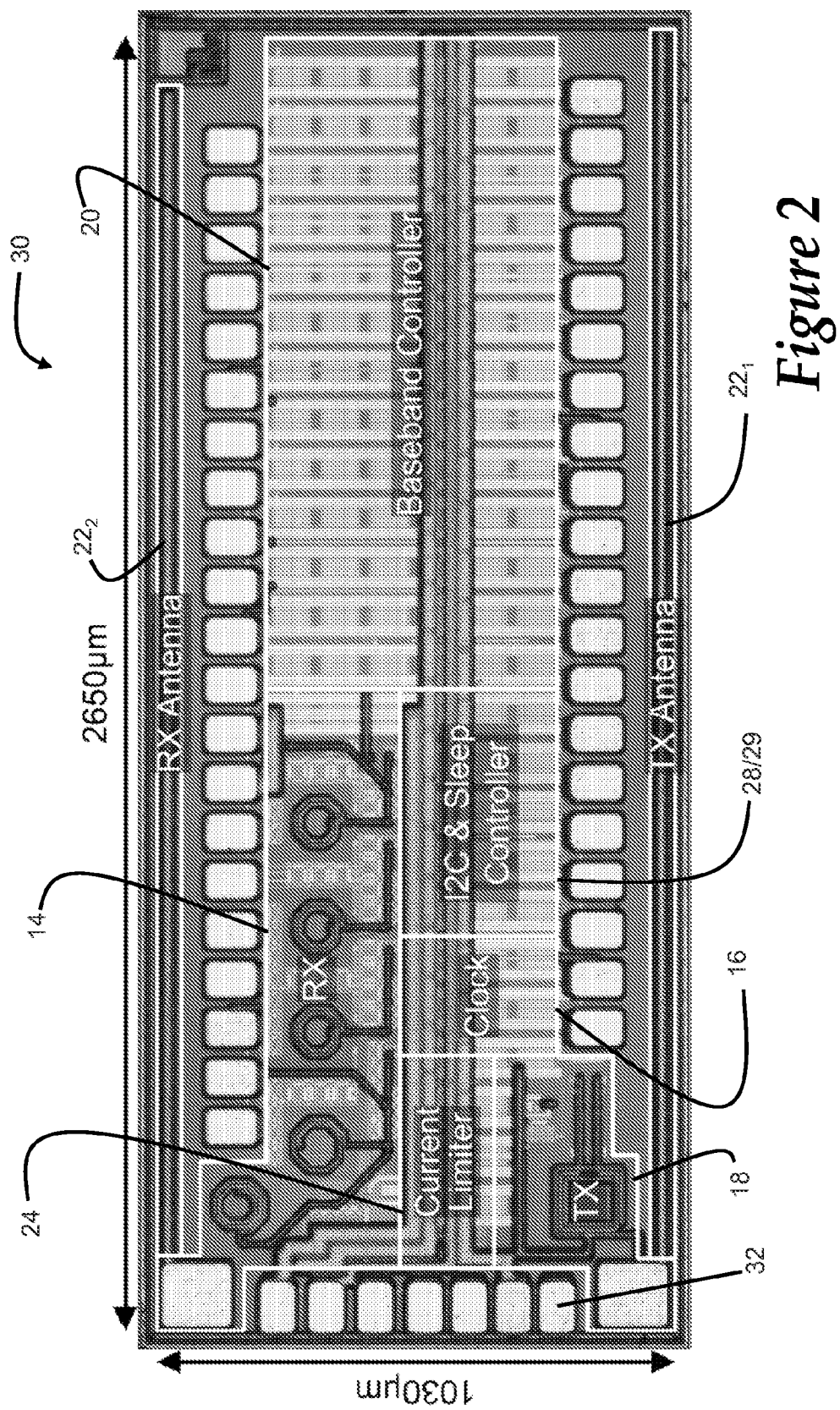
FIG. 2 is a plan view of an illustrative implementation of the integrated ultra wideband transceiver illustrated in FIG. 1.

FIG. 2 depicts a plan view of the transceiver 10 depicted in FIG. 1. As illustrated in FIG. 2, in an illustrative embodiment, a die comprising the transceiver 10 (i.e., die 30) occupies an area of approximately 2.73 mm², dominated by the baseband controller 20 (i.e., modem). In the embodiment illustrated in FIG. 2, the entire transceiver 10 is designed to operate from just the seven (7) pads 32 on the edge to enable die stacking; the remaining pads are for debugging and may be left open.

The micro-battery 12 of the transceiver 10 is configured to provide operating power to various components of the transceiver 10. In an embodiment, the micro-battery 12 may have a voltage of 3.2~4.1V and one or more components of the transceiver 10, such as, for example, the receiver 14 and the transmitter, and a combined power amplifier and electronic oscillator 34 of the transmitter 18 (e.g., the combined power amplifier and voltage controlled oscillator—PA/VCO 34), in particular, may each have an operating voltage equal or substantially equal to the voltage of the micro-battery 12. In such an instance, and with reference to FIG. 1, to protect the micro-battery 12 from over-current and/or under-voltage conditions, the current limiter 24 may be electrically connected between the micro-battery 12 and one or more of the components operating at the battery voltage. Further, and as illustrated in FIG. 1, the internal storage capacitor 26, which, in the illustrated embodiment, is electrically connected to the output of the current limiter 24 and one or more of the components operating at the battery voltage, may be provided to allow those components to draw higher current during, as will be described below, duty-cycled operation.

While certain components of the transceiver 10 may be operated at a voltage that is equal or substantially equal to the voltage of the micro-battery 12, other components may be operated at different voltage levels. For example, to reduce power consumption, certain components or blocks of the transceiver 10, such as, for example, the baseband controller 20, I²C controller 29, sleep controller 28, clock generator 16, and a pulse generator 36 of the transmitter 18, may operate at a voltage that is below the voltage of the micro-battery 12. For instance, in the embodiment illustrated in FIG. 1, such components may operate from, for example, a 1.2V $V_{DD}$. It will be appreciated that while certain voltage levels or magnitudes have been specifically identified above, in other embodiments, voltage levels other than those expressly provided herein may be used, and such embodiments remain within the spirit and scope of the present disclosure.

In any event, in view of the limited resources of the micro-battery 12, one or more (and in an illustrative embodiment all) of the components or blocks of the transceiver 10 may have a low-power sleep state, and may be toggled back and forth between an active state and the sleep state. For example, certain components or blocks, such as, for example, the receiver 14, portions of the transmitter 18 (e.g., the combined power amplifier/oscillator 34 and the pulse generator 36), and the current limiter 24 may be duty-cycled at the bit-level by the baseband controller 20. Other components, such as, for example, the I²C controller 29, clock generator 16, and baseband controller 20 itself, may be duty-cycled at the packet-level by the sleep controller 28. In such an embodiment, the sleep controller 28 may remain "on" continuously unless and until an under-voltage condition occurs. Further, the sleep controller 28 may be configured to begin and end the wake-up procedure for each packet using, for example, I²C communication that is known in the art with modified I/Os to eliminate pull-up resistors. Accordingly, it will be appreciated by those having ordinary skill in the art that the baseband controller 20 and sleep controller 28 may each comprise any variety of electronic processing device(s), memory device(s), input/output (I/O) device(s), and/or other components (e.g., software, firmware, and middleware) required to carry out the respective functionality of the baseband controller 20 and sleep controller 28 described herein above and below. It will be further appreciated that while one particular scheme or arrangement for controlling the sleep state of one or more transceiver components has been provided, the present disclosure is not meant to be so limited. Rather, it is contemplated that other suitable schemes or techniques for controlling the sleep state of the components of the transceiver 10 may be utilized, and such embodiments remain within the spirit and scope of the present disclosure.

With continued reference to FIG. 1, the receiver 14 is configured to receive signals comprised of one or more pulses, such as, for example, pulses in the 9.8 GHz range. In an embodiment, the receiver 14 is electrically connected between and to the baseband controller 20 and an antenna 22. As was at least briefly described above, the baseband controller 20 may be configured to exert a measure of control over some or all of the operations or functions of the receiver 14 (e.g., the baseband controller 20 may be configured to duty-cycle the receiver 14). For example, the baseband controller 20 may be configured to control (e.g., toggle) the operational state (e.g., active and sleep states) of some or all of the components of the receiver 14 to reduce the average power supplied to the receiver 14. One reason this may be necessary is that if the receiver 14 was constantly in the active state, the peak power of the micro-battery 12 may not be suitable to support the power drawn by the receiver 14, and thus, the receiver 14 may stop working By way of illustration, assume the receiver 14 is receiving data at a bit rate of 10 kb/s (i.e., 1 bit every 100 μs), and that the peak power of the micro-battery 12 is 10 μW. If the receiver 14 is active the entire time, the on-chip storage capacitor 26 may fully deplete, and because the peak power of the micro-battery 12 may not be able to support the active power of the receiver 14 (>300 μW), the receiver 14 may stop working. In an embodiment, the average power supplied to the receiver 14 may be reduced by duty-cycling the receiver 14 at a frequency that is faster than the bit rate. For example, if the bit rate is 10 kb/s such that one (1) bit of data is received every 100 μs, the receiver 14 may be active for only 6 μs of the 100 μs bit time, and off or in a sleep state for the remaining 94 μs every bit cycle. In such an embodiment, the receiver 14 may be configured to align those 6 μs of active-time around the time the bit arrives so no data is lost. Between 6 μs intervals, only a portion of the receiver 14 is powered down or put into the sleep state. All of the biasing circuitry remains active with low power, and only the higher power RF circuits are powered down. It will be appreciated that the example above and the various values corresponding thereto has been provided as one non-limiting example, and that embodiments wherein the receiver receives data at a different bit rate and/or the micro-battery has a different peak power, remain within the spirit and scope of the present disclosure.

As illustrated in FIG. 1, the antenna 22 to which the receiver 14 is connected may be a dedicated antenna (i.e., antenna $22_2$) or, alternatively, an antenna that is common to both the receiver 14 and transmitter 18. In an embodiment, the antenna 22 may comprise an integrated or on-chip antenna (i.e., the antenna is disposed on the same chip as the receiver 14 and other components of the transceiver 10); while in another embodiment, the antenna 22 may comprise an off-chip antenna to which the receiver 14 is configured to be electrically connected via, for example, one or more electrical conductors. For purposes of illustration, the description below will be with respect to the antenna comprising the on-chip antenna $22_2$ depicted in FIG. 1, though the present disclosure is not intended to be so limited. In the illustrated embodiment, the antenna $22_2$ may comprise a dedicated monopole antenna, for example, a 2 mm monopole antenna. It will be appreciated, however, that present disclosure is not intended to be limited to any particular type or size of antenna and it will be appreciated that any; rather, suitable antennas of a different size(s) and or type(s) may also be utilized.

Figure 3B:
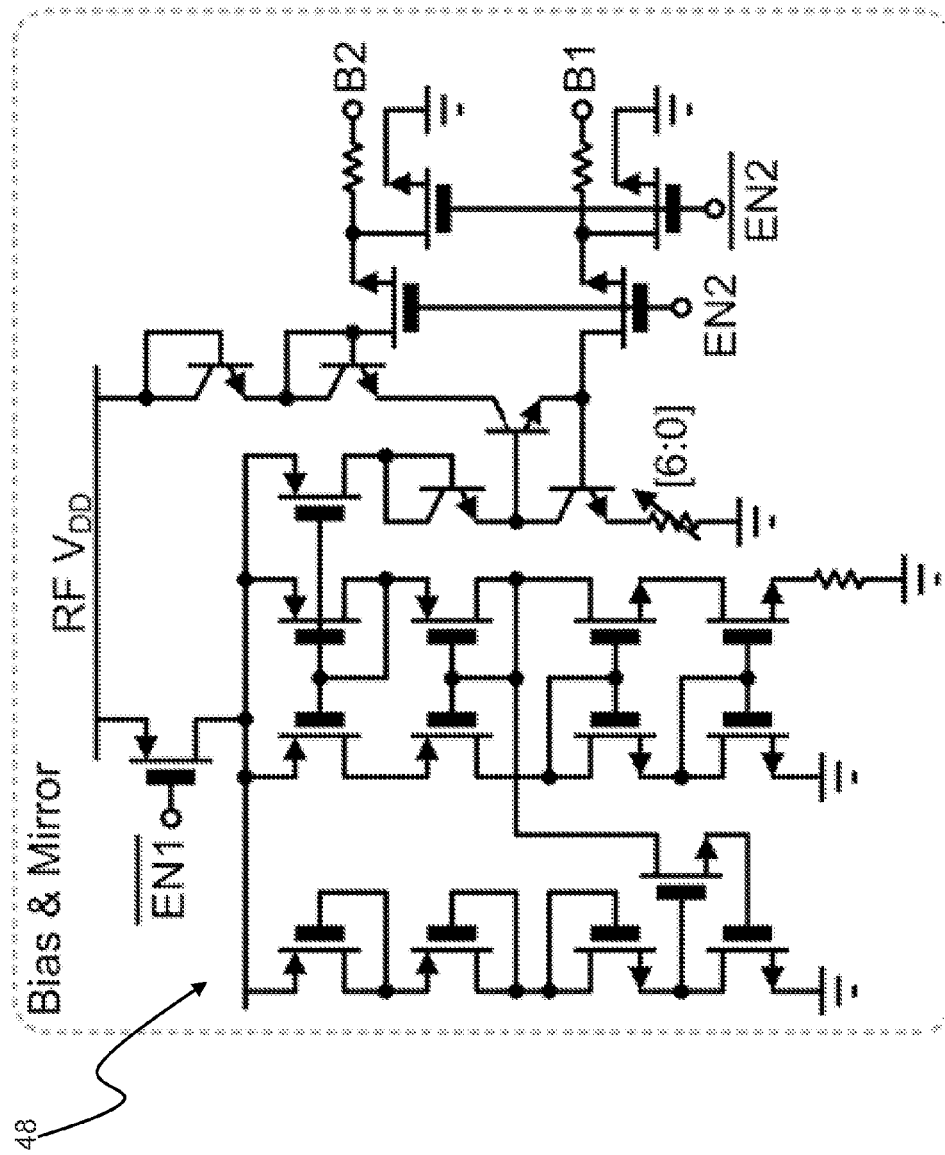

As shown in FIGS. 3a-3d, which depict illustrative embodiments of the receiver 14 and various components thereof, and which are collectively referred to herein as FIG. 3, the receiver 14 may have a non-coherent, energy-detection architecture. In such an embodiment, the architecture may comprise four (4) RF gain stages 38 (i.e., $38_1$-$38_4$) that amplify pulses received by the receiver 14 before down-converting them with a squaring mixer 40 located downstream from the gain stages 38. More particularly, the signal, or the pulses thereof, may be self-mixed using a common emitter amplifier with a resistive load as the squaring mixer. Once the pulses are down-converted by the mixer 40, the signal passes through a downstream baseband gain stage 42 before the signal path is split into two paths. Along one of the two paths, the pulses are passed directly to a downstream comparator 44. Along the other path, the signal is filtered by, for example, a low-pass filter (LPF) 46 to provide an auto-zeroed, DC-compensated reference level that is then passed to the comparator 44 for use in performing one or more comparisons. As illustrated in FIG. 3a, a reset signal (RST1) enables fast settling of the low-pass filter 46 for fast receiver turn-on. Finally, the comparator 44—which may comprise a continuous-time latching comparator with controllable hysteresis—is configured to digitize the incoming pulses. In an illustrative embodiment, bipolar junction transistors 48 may be used for higher RF gain efficiency ($g_m/I_C$), while the RF gain stages may be stacked in order to reuse current and better utilize the supply voltage. Additionally, in an illustrative embodiment, the RF center frequency may be tunable via four (4) binary-weighted control bits.

It will be appreciated that while the receiver 14 has only been described with respect to the particular architecture described above and illustrated in FIG. 3, it is contemplated that other suitable receiver architectures may be utilized. Accordingly, the present disclosure is not intended to be limited solely the receiver architecture described herein or any other particular architecture; rather embodiments of the transceiver 10 wherein the receiver 14 has an architecture other than that described herein remain within the spirit and scope of the present disclosure.

As briefly described above, in an exemplary embodiment, the transceiver 10 of the present disclosure comprises the clock generator 16 to perform a clocking function for the transceiver 10 and allow for the synchronization of the operation of various components of the transceiver 10. As illustrated in FIG. 1, the clock generator 16 is electrically connected to the baseband controller 20, and the baseband controller 20 is configured to exert a measure of control over the operation of the clock generator 16. In order to reduce both power consumption and area of the transceiver 10, as compared to conventional transceivers that typically utilize crystals to perform a clocking function, in an exemplary embodiment, the transceiver 10 of the present disclosure includes a relaxation oscillator rather than a crystal.

Figure 8A:
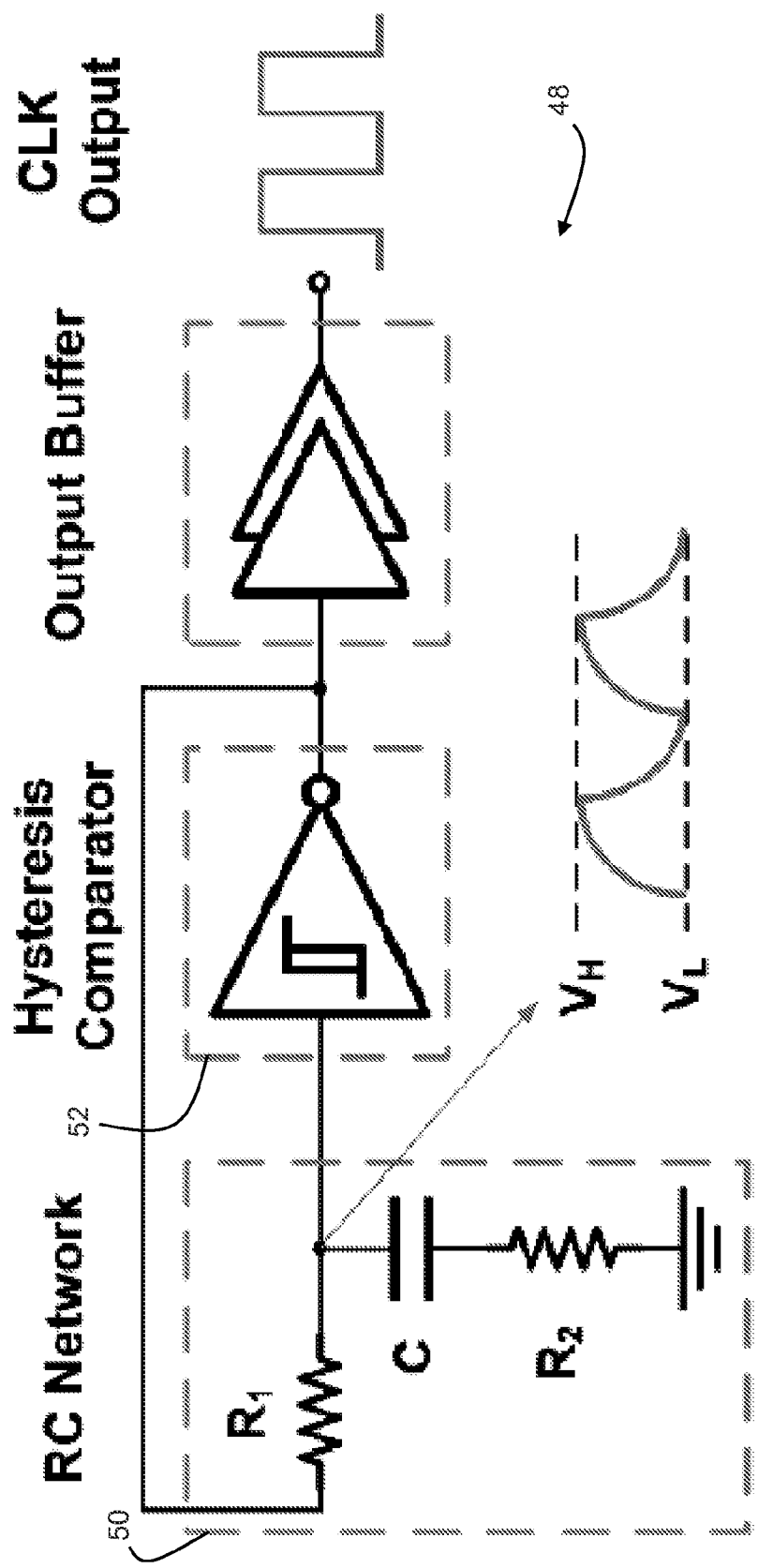
FIGS. 8a and 8b are diagrammatic and schematic views of another illustrative embodiment of a relaxation oscillator and various components thereof of the integrated ultra wideband transceiver illustrated in FIG. 1.

In an embodiment, the relaxation oscillator comprises a temperature-compensated relaxation oscillator. More particularly, and with reference to FIG. 4a and FIGS. 8a and 8b, the transceiver 10 may comprise a relaxation oscillator 48 with a modified RC network 50 and a single-ended hysteretic comparator 52 (e.g., inverting comparator) for on-chip clocking. The oscillator 48 may further include an output buffer electrically connected to and downstream of the comparator 52 that is operative to drive the clock output. In the illustrated embodiments, the RC network 50 is electrically connected in circuit (e.g., serially) with, and is disposed upstream of, the comparator 52. In an illustrative embodiment, the RC network 50 comprises a resistor R1 electrically connected in circuit (e.g., series) with the series combination of a resistor R2 and a capacitor C. More particularly, the first resistor R1 may be electrically connected in series with the capacitor C, which, in turn may be electrically connected in series with the second resistor R2. The second resistor R2 may be electrically connected between the capacitor C and ground. In the embodiment illustrated in FIG. 4a, the resistor R1 may also be connected in circuit with another capacitor (e.g., a variable capacitor) VC, the circuit combination of the resistor R1 and capacitor VC being connected in circuit with the combination of the resistor R2 and capacitor C, as shown.

The comparator 52 has switching thresholds of $V_H$ and $V_L$, which define the charging and discharging levels of the RC network 50. When the output of the comparator 52 is logic high, the capacitor C of the RC network 50 is being charged until the voltage becomes larger than $V_H$. Then the output of the comparator 52 flips to the logic low state and discharges the capacitor C until the voltage reaches $V_L$. Oscillation is achieved through back and forth charging and discharging processes, and the frequency is determined by the resistance and capacitance of the RC network 50. Accordingly, it will be appreciated that the particular values of the components of the RC network 50 may be chosen to take into account factors such as the frequency of oscillation (i.e., target reference frequency) and temperature stability. For purposes of illustration, in a non-limiting example the resistor R1 is a P+ polysilicon 24KΩ resistor, the resistor R2 is an N+ doped diffusion resistor of 28KΩ, and the capacitor C is a MIM capacitor; and the temperature coefficients for these components may be as follows: resistor R1—77 ppm/° C.; resistor R2—1810 ppm/° C.; and 15 ppm/° C.

Figure 4A:
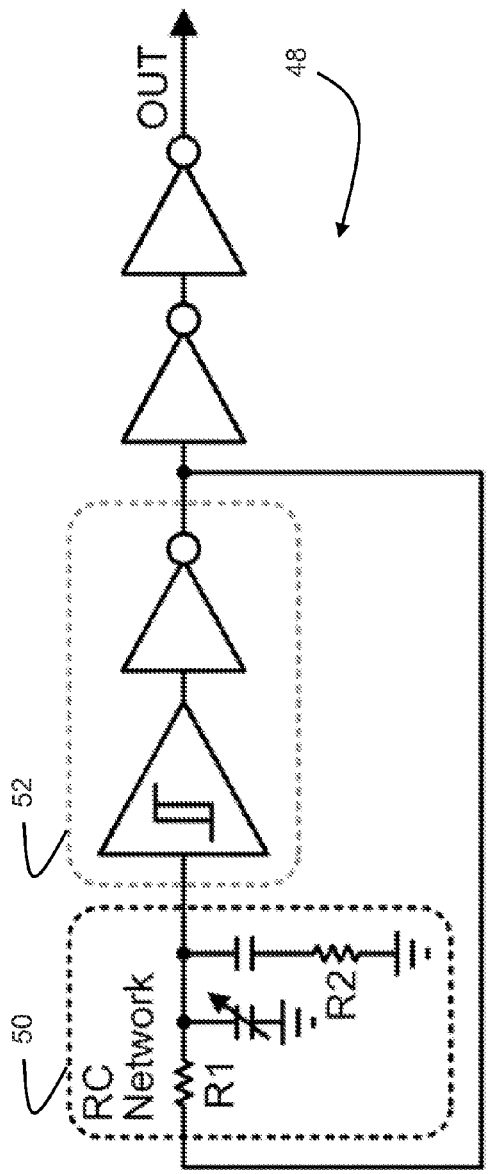
FIGS. 4a-4d are diagrammatic and schematic views of illustrative embodiments of a relaxation oscillator and various components thereof of the integrated ultra wideband transceiver illustrated in FIG. 1, and graphical representations of illustrative operational characteristics of the relaxation oscillator.

The arrangement of the RC network 50 illustrated in FIG. 4a serves to add an additional zero in the transfer function from the resistor R2 of the RC network 50 over conventional relaxation oscillators, thereby providing an additional degree-of-freedom for temperature compensation. More particularly, with the addition of the resistor R2, the transfer function is $$T(s) = \frac{1 + sR_2C}{1 + s(R_1 + R_2)C}.$$

Figure 4B:
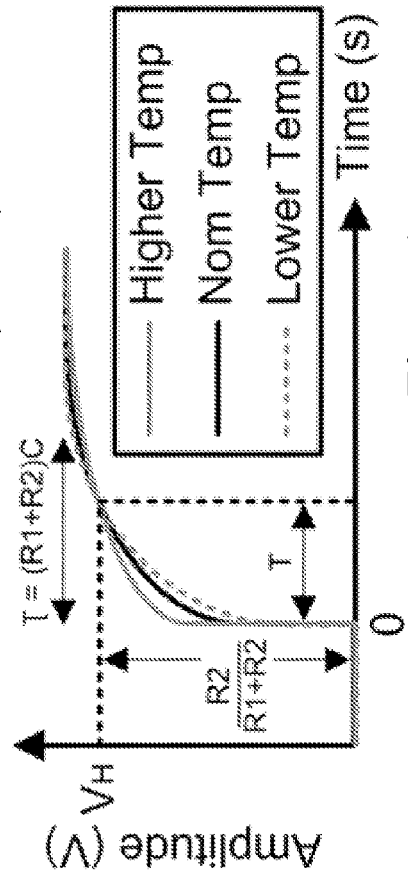

As shown in FIG. 4b, as temperature increases, the initial step at time t=0 from the zero increases, but the time constant of the exponential decay also increases, offsetting the step and resulting in a constant time, T, to trigger the switching threshold, $V_H$. The same trend applies as temperature decreases in that the initial step decreases while the time constant also decreases so that the overall period remains unchanged. Unlike conventional approaches that decrease temperature dependency with a combination of resistors with positive and negative temperature coefficients, the RC network 50 provides more degrees of freedom on resistor selections (i.e., the temperature coefficients of the resistors do not need to be opposite-polarity). In an embodiment, R1 may be chosen to have a smaller temperature coefficient and R2 to have a larger temperature coefficient. By tuning the combination of R1, R2, C, $V_H$, $V_L$, the period of the RC network 50 may remain fairly constant over a wide temperature range.

Figures 4C, 4D:
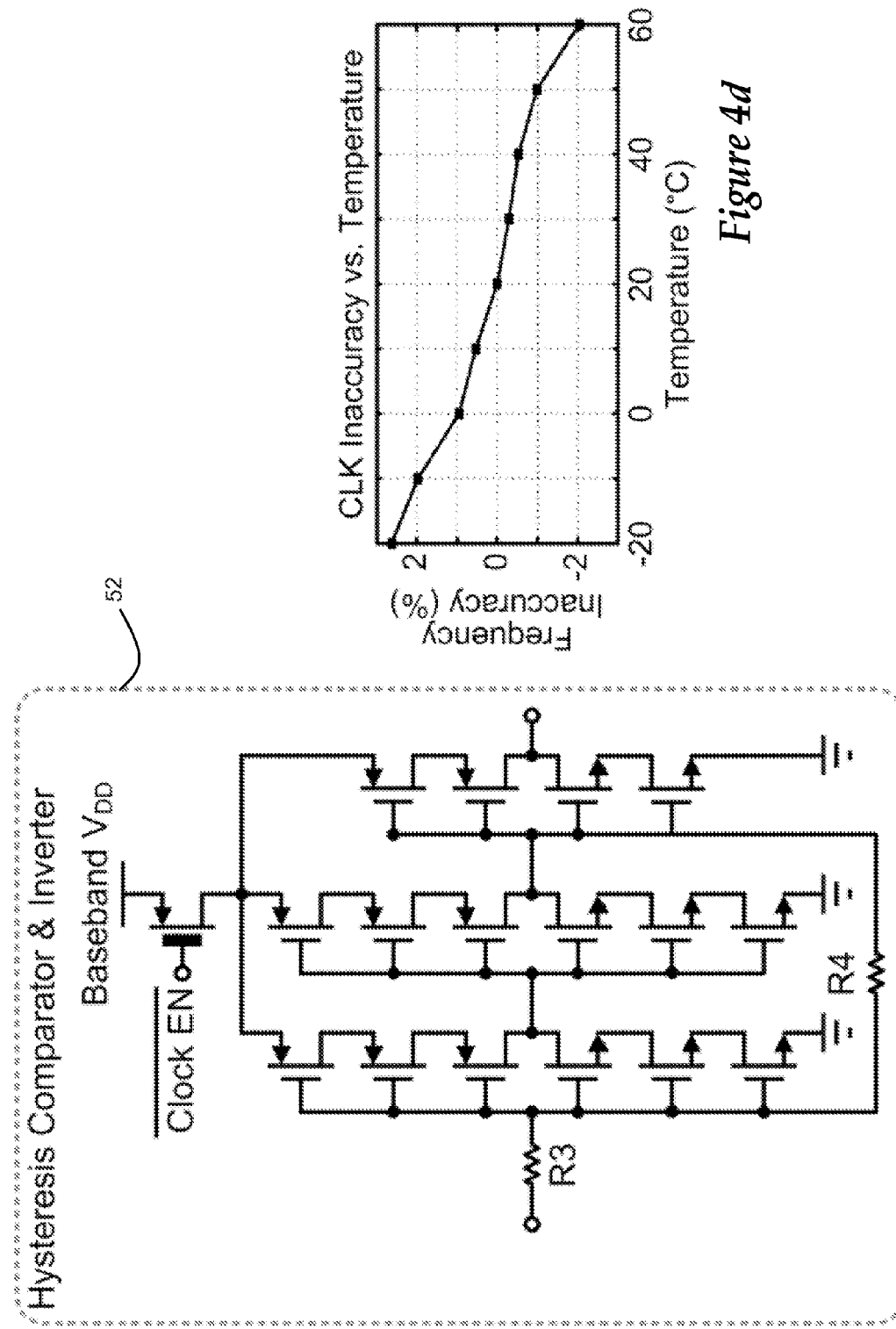
Figure 5B:
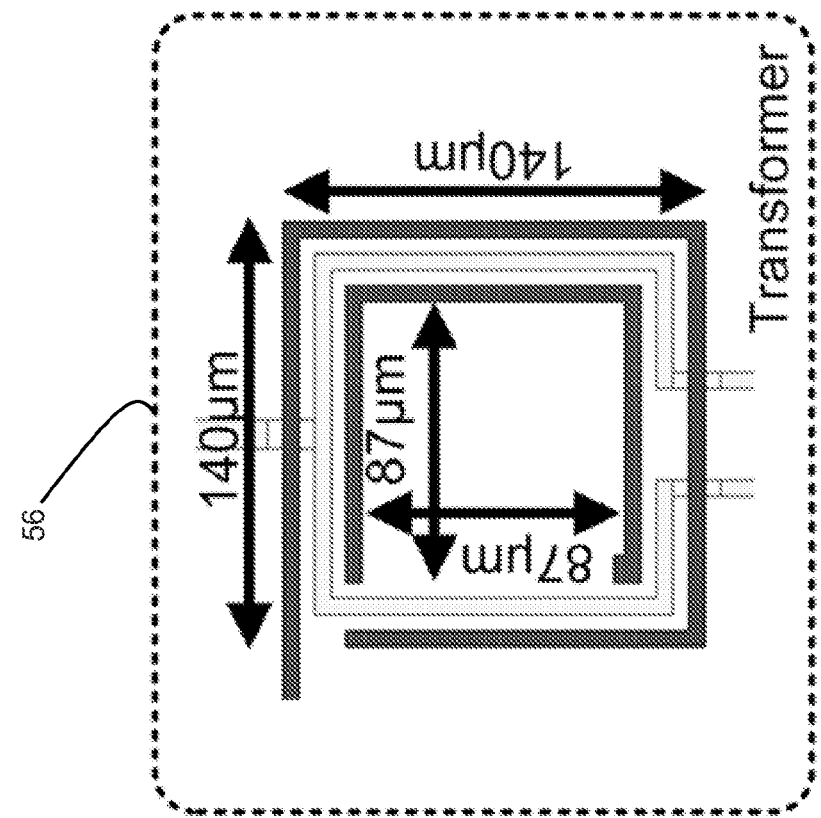
FIGS. 5a-5d are diagrammatic and schematic views of illustrative embodiments of a transmitter and various components thereof of the integrated ultra wideband transceiver illustrated in FIG. 1, and graphical representations of illustrative operational characteristics of the transmitter.
Figure 5A:
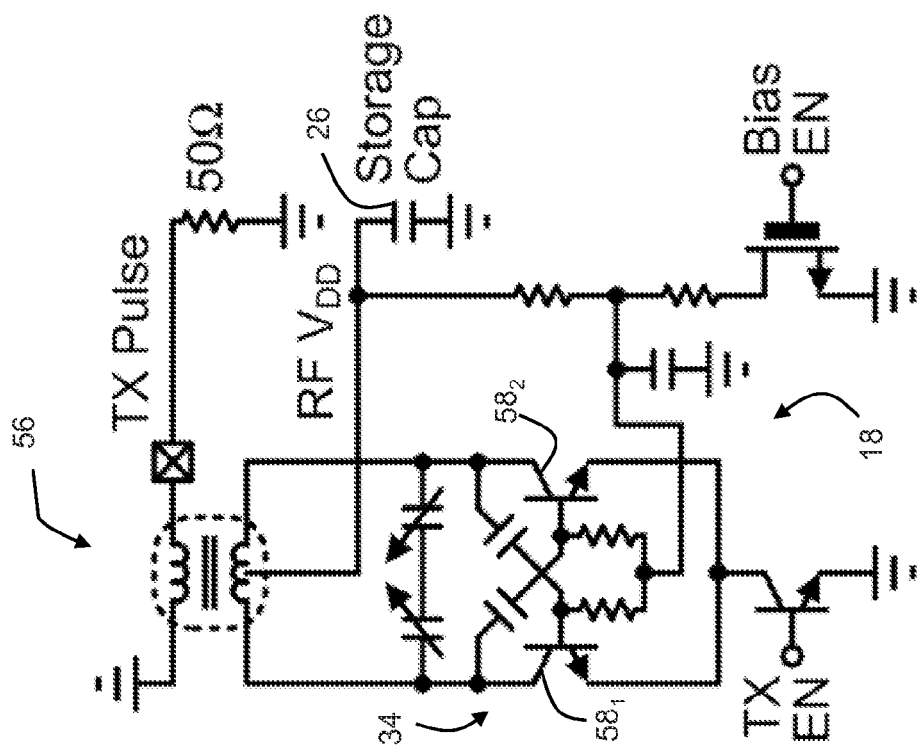
Figure 5C:
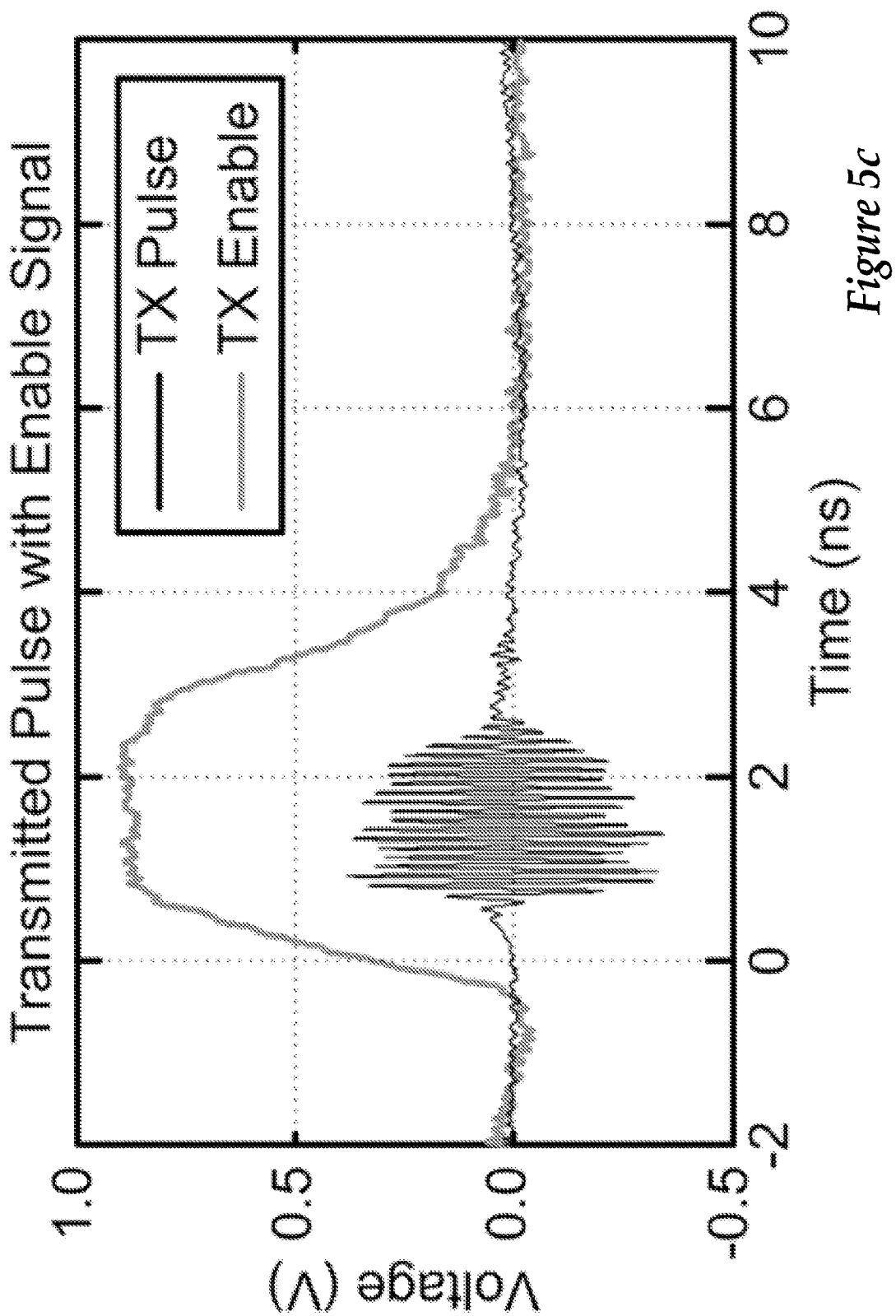
Figure 5D:
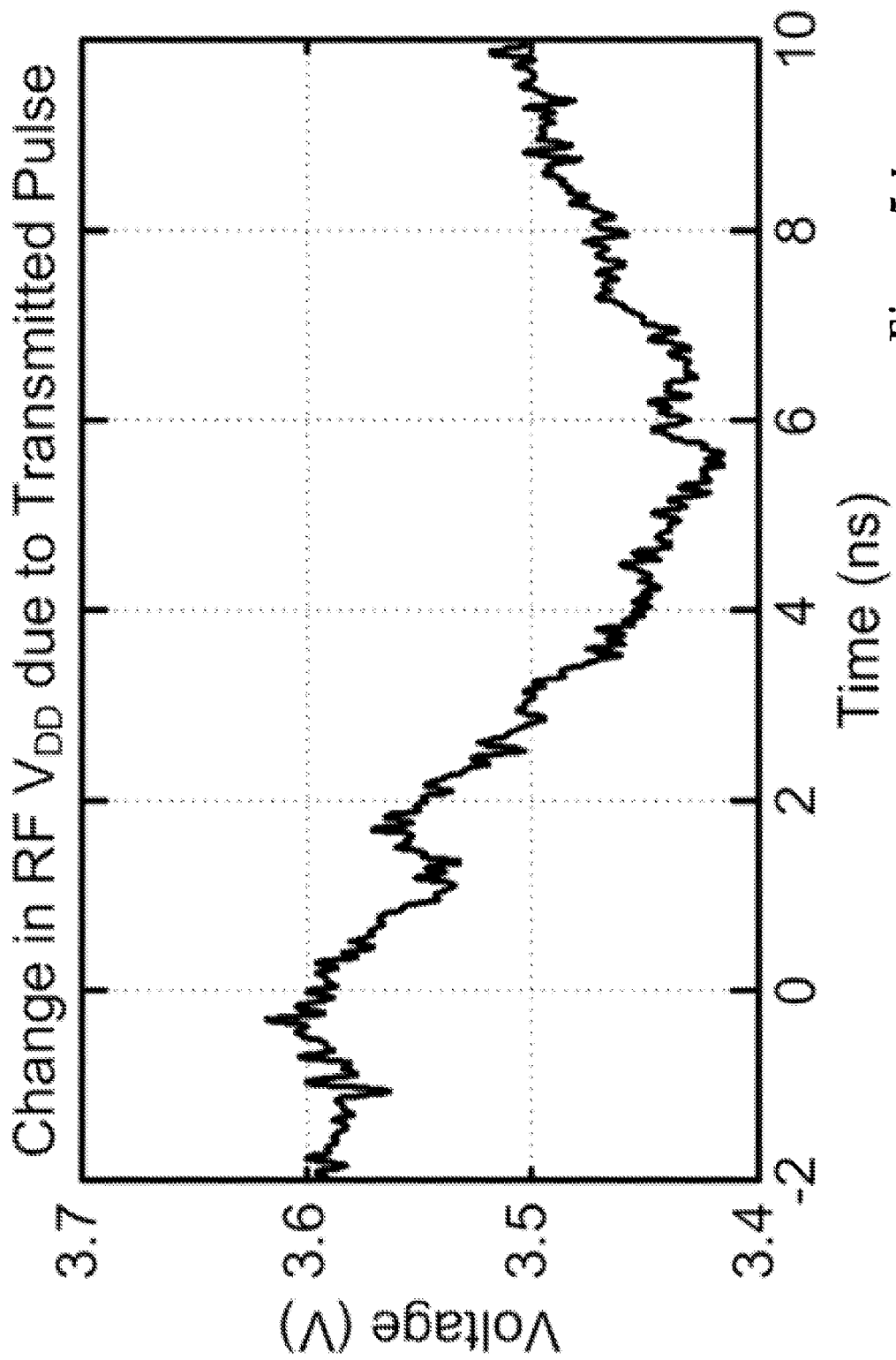
Figure 8B:
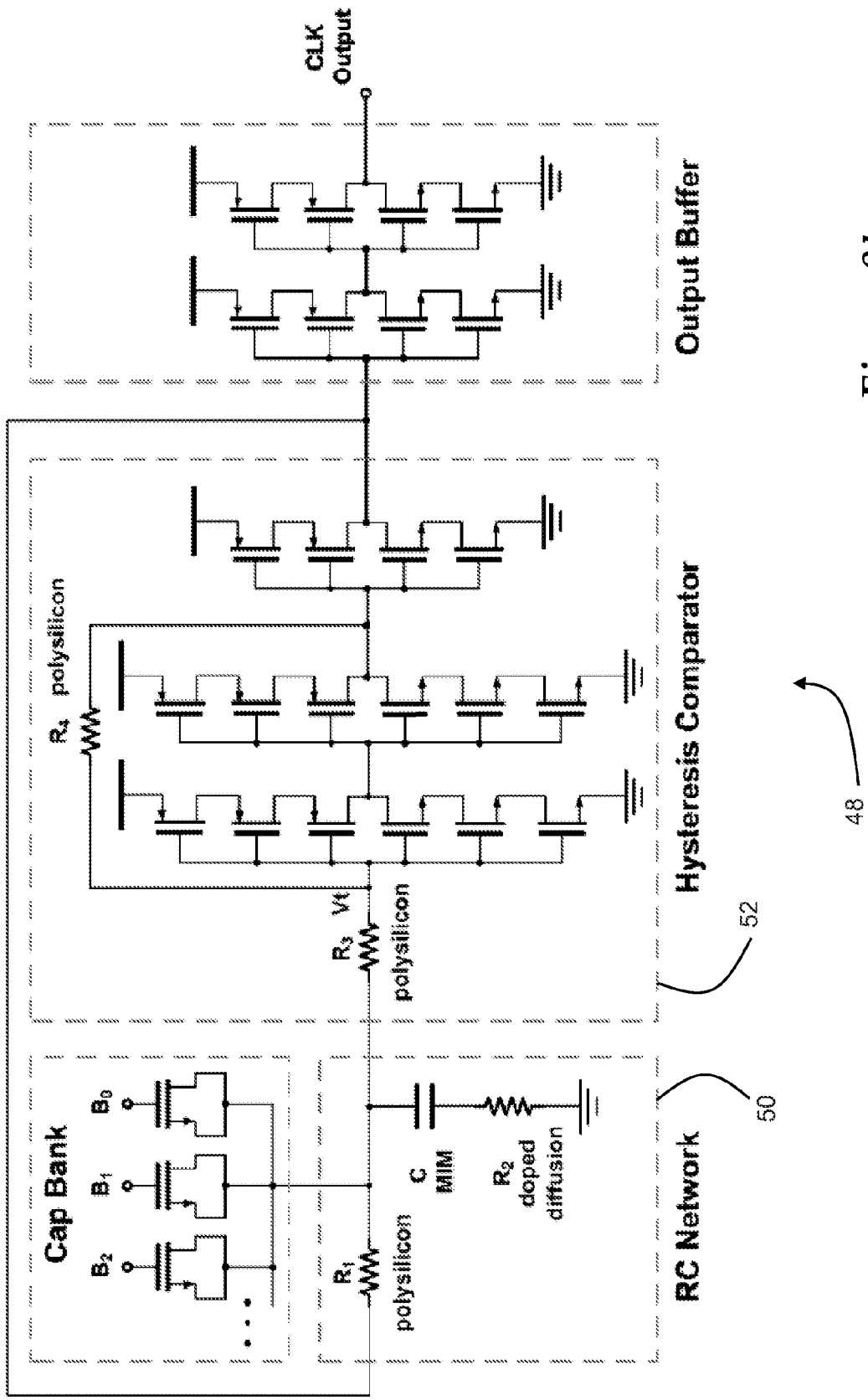

As shown in FIGS. 4c and 8b, the comparator 52 may comprise stacked inverters with hysteresis levels set by two resistors, R3 and R4 (i.e., the resistors R3, R4 set the hysteresis levels of the comparator 52 to be a certain, known, and temperature independent fraction of the power supply voltage. This works in conjunction with the RC network 50 to provide the target frequency and temperature independence of the oscillator 48). Stacking field effect transistors (i.e., transistors 56) in the manner illustrated serves to reduce leakage power while the oscillator 48 is asleep, and a capacitor bank (e.g., a 5-bit capacitor bank such as that shown in FIG. 8b) may be included with the oscillator 48 for one-time process calibration of frequency. In an embodiment, the comparator 52 comprises three (3) stacked inverters along with the resistors R3, R4. The first two stacked inverters with resistors R3, R4 serve as a high gain amplifier with resistive feedback, providing a sharp transition for the step response and the proper value of $V_H$ and $V_L$. With particular reference to the embodiment illustrated in FIG. 8b, assume for purposes of example only that the output of the hysteresis comparator is at ground and the input of the last inverter is $V_{DD}$. In such an instance, the voltage $V_t$ between R3 and R4 can be described in terms of comparator input $V_{in}$ as $$V_t = Vin + \left(\frac{R_3}{R_3 + R_4}\right)(V_{DD} - Vin).$$

When $V_t$ is equal to $V_{DD}/2$, which is the switching threshold of the stacked inverters, VL can be solved as $$Vin = V_L = \left(\frac{R_4 - R_3}{2R_4}\right)V_{DD}.$$

Similarly, when the comparator output is $V_{DD}$, $V_t$ then becomes $$V_t = \left(\frac{R_4}{R_3 + R_4}\right)Vin.$$

Finally, $V_H$ can be solved by applying $V_t=V_{DD}/2$ such that $$Vin = V_H = \left(\frac{R_4 + R_3}{2R_4}\right)V_{DD}.$$

In an embodiment, the value of the resistor R3 is twice the value of the resistor R4, so that $V_H$ is around ¾$V_{DD}$ and $V_L$ is around ¼$V_{DD}$ regardless of the supply voltage. Such an arrangement provides the oscillator 48 immunity to $V_{DD}$ variation. The last inverter flips the polarity for charging and discharging the RC network 50 to create the oscillation.

As shown in FIG. 4d, in one implementation provided for illustrative purposes only, the oscillator 48 has a measured variation of 1% over a range of 0° C. to 50° C. that allows the transmitter 18 and receiver 14 of the transceiver 10 to be heavily duty-cycled between pulses by, for example, the baseband controller 20, in order to give the on-chip storage capacitor 26 time to fully recharge and also sufficient accuracy to maintain network synchronization.

It will be appreciated that while a particular embodiment of the relaxation oscillator 48, RC network 50, and comparator 52 is described in detail above, the present disclosure is not meant to be limited to such an embodiment. Rather, it is contemplated that other arrangements or constructions of the oscillator 48, RC network 50, and/or comparator 52 that are suitable for the purposes of this disclosure may be utilized, and such other arrangements/constructions remain within the spirit and scope of the present disclosure.

Turning back to the illustrative embodiment of the transceiver 10 illustrated in FIG. 1, as briefly described above, the transmitter 18 of the transceiver 10 may comprise a combined power amplifier/voltage controlled oscillator 34 and a pulse generator 36. As with the receiver 14 described above, the transmitter 18 is electrically connected between and to the baseband controller 20 and an antenna 22, and the baseband controller 20 may be configured to exert a measure of control over some or all of the operations or functions of the transmitter 18. For example, the baseband controller 20 may exert a measure of control over the pulse generator 36 of the transmitter 18 to control the content and/or format of electronic signals generated by the pulse generator 36, as well as controlling when the pulse generator 36 generates those electronic signals, to cite a few possibilities. As illustrated in FIG. 1, the antenna 22 to which the transmitter 18 is connected may be a dedicated antenna (i.e., the antenna $22_1$) or, alternatively, an antenna that is common to both the transmitter 18 and the receiver 14. In an embodiment, the antenna 22 may comprise an integrated or on-chip antenna (i.e., the antenna is disposed on the same chip as the transmitter 18 and other components of the transceiver 10); while in another embodiment, the antenna 22 may comprise an off-chip antenna to which the transmitter 18 may be electrically connected via, for example, one or more electrical conductors. For purposes of illustration, the description below will be with respect to the antenna comprising the on-chip antenna $22_1$ depicted in FIG. 1, though the present disclosure is not intended to be so limited. In the illustrated embodiment, the antenna $22_1$ may comprise a dedicated monopole antenna, for example, a 2 mm monopole antenna. It will be appreciated, however, that the present disclosure is not intended to be limited to any particular type or size of antenna, and that suitable antennas of different size(s) and/or type(s) may also be utilized.

FIGS. 5a-5d depict illustrative examples of the composition and operational characteristics of illustrative embodiments of the transmitter 18 and various components thereof, and are referred to herein collectively as FIG. 5. In an embodiment, pulses transmitted by the transmitter 18 are generated by the combined power amplifier/voltage controlled oscillator 34 shown in FIG. 1 and in the illustration of the portion of the transmitter in FIG. 5. In an embodiment such as that illustrated in FIG. 5, an LC cross-coupled topology is utilized for fast turn-on time, and a transformer-coupled scheme (the transformer being identified as reference numeral 54 in FIGS. 5a and 5b) boosts the signal swing delivered to the antenna $22_1$. The area of the internal matching network between the voltage controlled oscillator and the power amplifier is reduced by direct transformer coupling.

In an embodiment, the transmitter 18 is enabled by the baseband controller 20 through the digital pulse generator 36 of the transmitter 18. In an illustrative embodiment, the pulse generator 36 has a 4-bit tuning range of 1.2 ns to 6.0 ns, and when enabled, the transmitter 18 is operable to deliver a 700 mV$_{pp}$ pulse to a 50Ω load, for example. Further, the center frequency of the transmitted signal may be tuned using, for example, a capacitor bank (e.g., a 7-bit capacitor bank). In the embodiment illustrated in FIG. 5, the cross-coupled capacitors control the oscillating signal magnitude on the base terminals and are designed so that voltage swing never exceeds the breakdown voltage of the bipolar junction transistors $58_1$, $58_2$ of the transmitter 18. In an illustrative embodiment, while the transmitter 18 is generating a pulse, the internal power supply voltage on the storage capacitor 26 may drop rapidly (e.g., approximately 200 mV in a few ns, in an embodiment) due to protection provided by the current limiter 24. Between pulses, the storage capacitor 26 recharges. The tail device is large such that it enters the saturation region fast once the transmitter enable signal (TX EN in FIG. 5) is high. In an illustrated embodiment, a 60 mA current is drawn from the voltage controlled oscillator when it begins oscillating; however, due to the high on-to-off current ratio of the bipolar junction transistors 58 ($>10^8$), the sleep power of the transmitter 18 is 170 pW.

Transmitter 18 has been described with respect to the architecture disclosed above and illustrated in FIGS. 1 and 5, it is contemplated that other suitable transmitter architectures may be utilized. Accordingly, the present disclosure is not intended to be limited solely the illustrative transmitter architecture described herein or any other particular architecture; rather embodiments of the transceiver 10 wherein the transmitter 18 has an architecture other than that described herein remain within the spirit and scope of the present disclosure.

Figure 6A:
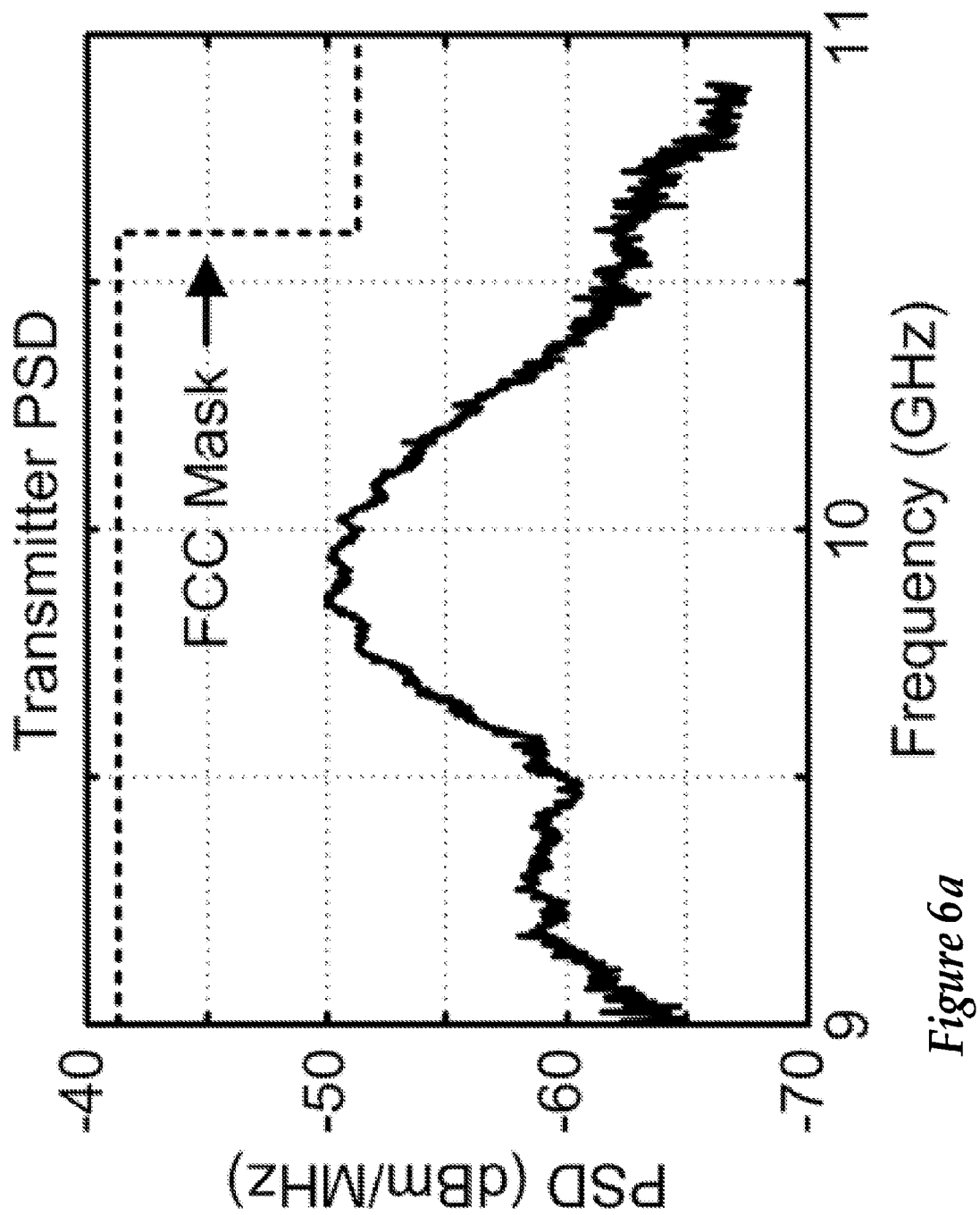
FIGS. 6a-6d are graphical representations of measurements/performance results of various components of an illustrative implementation of the transceiver illustrated in FIG. 1.
Figure 6B:
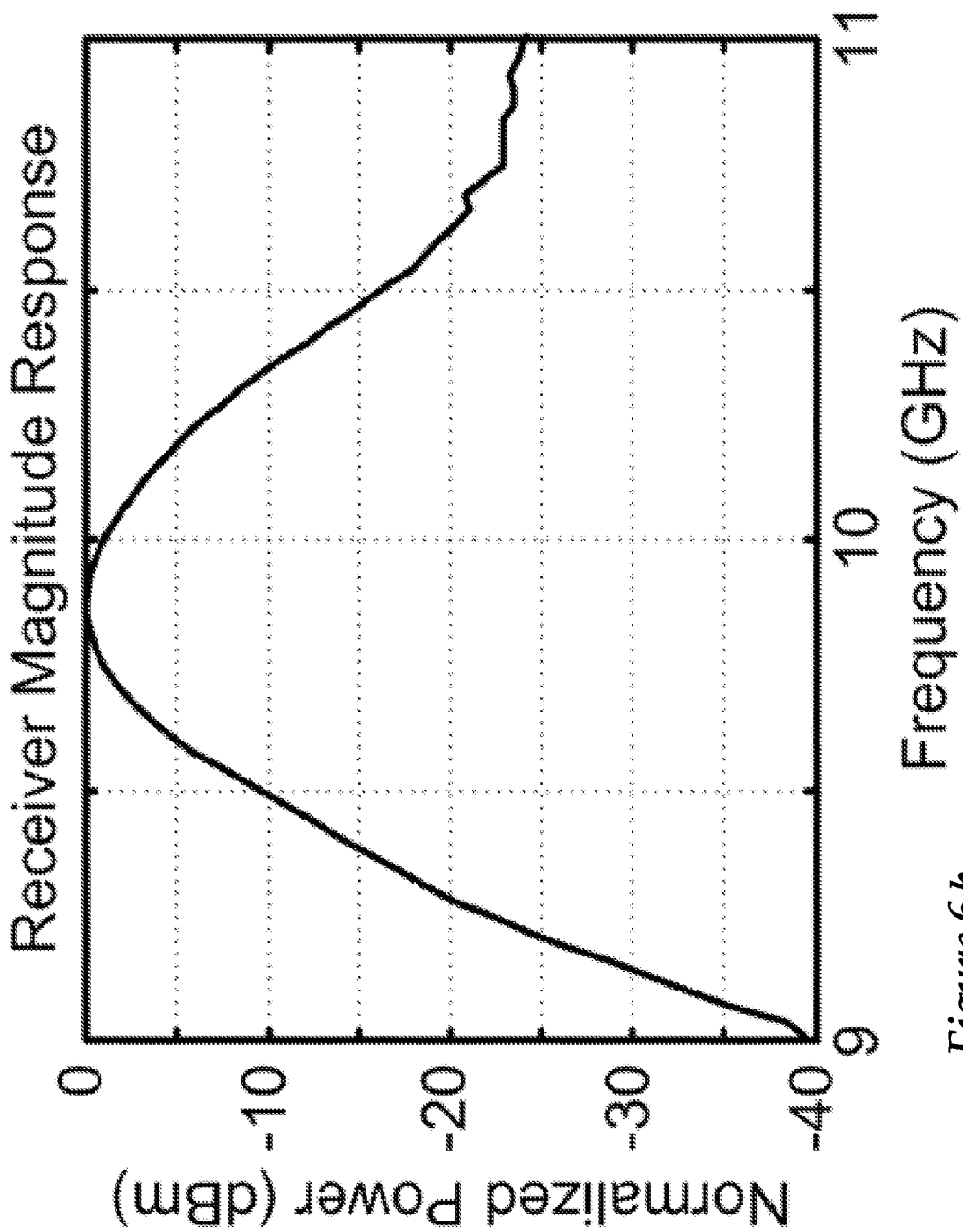
Figure 6C:
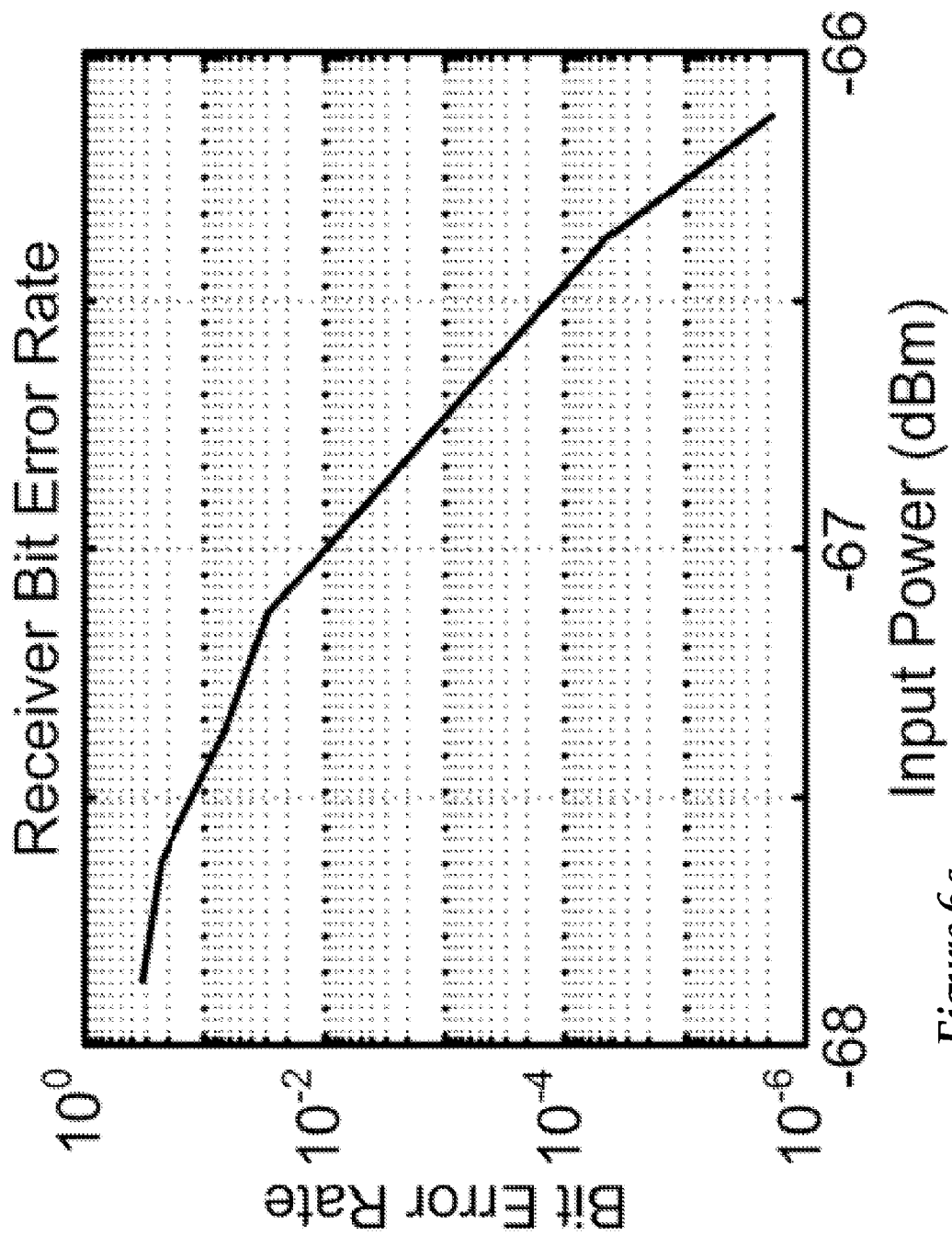
Figure 6D:
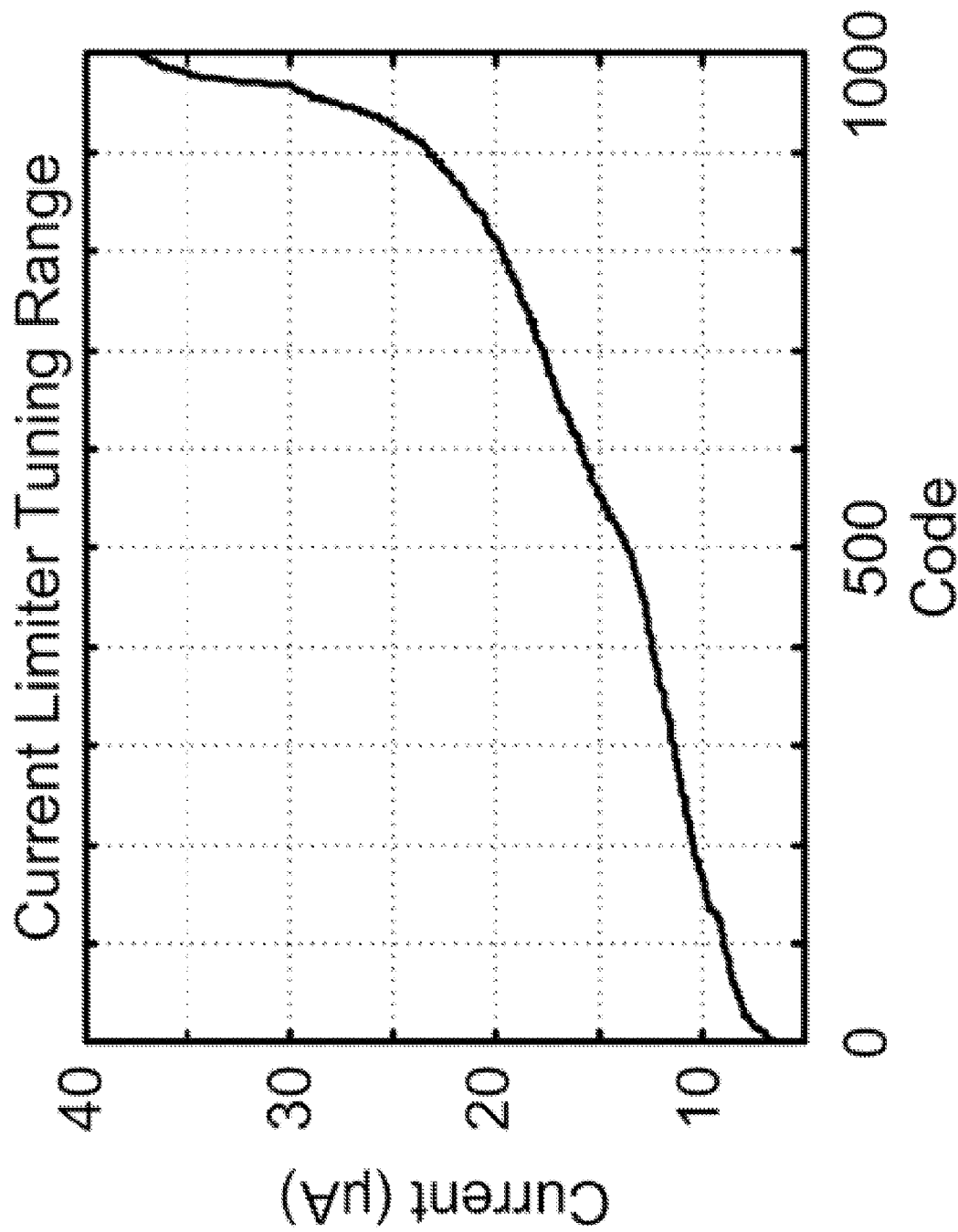

With reference to FIGS. 6a-6d and 7, and for purpose of illustration only, a description of the performance of one particular, non-limiting implementation of the transceiver 10 will now be provided. In this particular implementation, the transceiver 10 was fabricated in 0.18 μm BiCMOS with MIM capacitors, and the load to which the transmitter 18 delivers a pulse is a 50Ω load. The power spectrum density of the transmitter 18 is shown in FIG. 6a. In this implementation, the transmitter 18 has a tuning range of 9-12 GHz, and when tuned to 9.8 GHz, the transmitter 18 has a peak output power of 0.9 dBm and satisfies the FCC mask. At a 30 kb/s data rate, the average power of the transmitter 18 is only 22.4 μW at 3.6V. As shown in FIG. 6b, the magnitude response of the receiver 14 is tuned to 9.8 GHz. At a $10^{-3}$ bit error rate, the receiver 14 has a sensitivity of about −67 dBm (as shown in FIG. 6c) and a 30 kb/s data rate while consuming an average of 37 μW from a 3.6V supply with 6% duty-cycling. The baseband controller 20 (i.e., modem) uses pulse position modulation ("PPM") and includes early/late tracking of pulses for each PPM window to maintain synchronization. At a 3 MHz oscillation frequency of the relaxation oscillator 48, the entire baseband system consumes 269 μW, of which the clock consumes 12.7 μW. As provided in FIG. 6d, the current limiter 24 has a 6-38 μA tuning range, which is sufficient for sustained operation of the transmitter 18 and the receiver 14. The current limiter 24 consumes only 223 nW, yielding a 94% efficiency. Each block of the transceiver 10 consumes <1 nW while asleep by carefully including thick-oxide headers on all blocks, making this system ideal for heavily duty-cycled cubic-mm sensor nodes. A complete performance summary of illustrative transceiver implementation described over is provided in FIG. 7.

The above-described performance relates to one particular implementation of the transceiver 10 delivering a pulse(s) to a particular load, and the present disclosure is not intended to be limited to such an implementation. Rather, it is contemplated that the transceiver 10 may be implemented in a number of suitable ways other than that corresponding to the performance characteristics described above, and each such implementation remains within the spirit and scope of the present disclosure.

It is to be understood that the foregoing description is of one or more embodiments of the invention. The invention is not limited to the particular embodiment(s) disclosed herein, but rather is defined solely by the claims below. Furthermore, the statements contained in the foregoing description relate to the disclosed embodiment(s) and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Further, the term "electrically connected" and the variations thereof is intended to encompass both wireless electrical connections and electrical connections made via one or more wires, cables, or conductors (wired connections). Other terms are to be construed using their broadest reasonable meaning unless they are used in a context that requires a different interpretation.

The invention claimed is:

1. An integrated ultra wideband transceiver, comprising:
a transmitter;
a receiver;
a clock generator;
a baseband controller electrically connected to, and configured to exert a measure of control over, at least one of the transmitter, receiver, or clock generator; and
a micro-battery operative to provide operating power to each of the transmitter, receiver, clock generator, and baseband controller,
wherein the baseband controller is configured to control a duty cycle of the receiver at a frequency that is faster than a bit rate at which the receiver receives data, and such that the receiver is in an active state of operation for only a portion of each bit cycle corresponding to the bit rate, and further wherein the portion of each bit cycle that the receiver is active is less than the entirety of the bit cycle.

2. The transceiver of claim 1, further comprising at least one monopole antenna electrically connected to at least one of the transmitter or receiver for transmitting and/or receiving electrical signals.

3. The transceiver of claim 2, wherein the at least one monopole antenna comprises at least one on-chip monopole antenna.

4. The transceiver of claim 2, wherein the transmitter and receiver are configured to be electrically connected to at least off-chip monopole antenna.

5. The transceiver of claim 1, wherein the clock generator comprises a temperature-compensated relaxation oscillator.

6. The transceiver of claim 1, further comprising a current limiter electrically connected between the micro-battery and at least one of the transmitter, receiver, clock generator, or baseband controller.

7. The transceiver of claim 6, further comprising a storage capacitor electrically connected to the current limiter and the at least one of the transmitter, receiver, clock generator, or baseband controller.

8. The transceiver of claim 7, wherein the storage capacitor comprises an on-chip storage capacitor.

9. The transceiver of claim 1, wherein at least one of the transmitter, receiver, clock generator, or baseband controller is configured to operate in a sleep state, and may be toggled back and forth between an active state and the sleep state.

10. The transceiver of claim 9, wherein the baseband controller is operable to control the duty cycle of at least one of the transmitter, receiver, or clock generator to cause the at least one of the transmitter, receiver, or clock generator to enter the sleep state.

11. The transceiver of claim 1, wherein the clock generator comprises a relaxation oscillator.

12. The transceiver of claim 11, wherein the relaxation oscillator of the clock generator comprises an RC network connected in circuit with a hysteretic comparator.

13. The transceiver of claim 12, wherein the RC network comprises a first resistor electrically connected in circuit with a first capacitor, and a second resistor electrically connected in circuit with a second capacitor, wherein the combination of the first resistor and the first capacitor is electrically connected in circuit with the combination of the second resistor and the second capacitor.

14. The transceiver of claim 12, wherein when an output of the comparator is a logic high, a capacitor of the RC network is charged until the voltage of the capacitor exceeds a first predetermined threshold, then the output of the comparator goes to a logic low and the capacitor is discharged until the voltage of the capacitor reaches a second predetermined threshold.

15. The transceiver of claim 1, wherein the transmitter comprises a combination power amplifier and voltage controlled oscillator, and a pulse generator.

16. The transceiver of claim 1, wherein the receiver comprises at least one RF gain stage configured to amplify pulses received by the receiver, and a squaring mixer configured to down-convert the pulses amplified by the at least one RF gain stage.

17. The transceiver of claim 16, wherein the receiver further comprises a comparator disposed downstream of the squaring mixer and configured to digitize pulses received thereby.

18. The transceiver of claim 1, wherein the receiver comprises a plurality of RF gain stages, and further wherein the RF gain stages are stacked.

19. The transceiver of claim 1, wherein the power drawn by the receiver when in an active state of operation is greater than a peak power of the micro-battery.

20. An integrated ultra wideband transceiver, comprising:
a transmitter;
a receiver;
at least one on-chip monopole antenna electrically connected to at least one of the transmitter or receiver for transmitting and/or receiving electrical signals;
a clock generator;
a baseband controller electrically connected to, and configured to exert a measure of control over, at least one of the transmitter, receiver, or clock generator; and
a micro-battery operative to provide operating power to each of the transmitter, receiver, clock generator, and baseband controller,
wherein the baseband controller is configured to control a duty cycle of the receiver at a frequency that is faster than a bit rate at which the receiver receives data, and such that the receiver is in an active state of operation for only a portion of each bit cycle corresponding to the bit rate, and further wherein the portion of each bit cycle that the receiver is active is less than the entirety of the bit cycle.

21. The transceiver of claim 20, further comprising a current limiter electrically connected between the micro-battery and at least one of the transmitter, receiver, clock generator, or baseband controller.

22. The transceiver of claim 21, further comprising an on-chip storage capacitor electrically connected to the current limiter and the at least one of the transmitter, receiver, clock generator, or baseband controller.

23. The transceiver of claim 20, wherein the at least one on-chip antenna comprises a first on-chip monopole antenna electrically connected to the transmitter for transmitting electrical signals, and a second on-chip monopole antenna electrically connected to the receiver for receiving electrical signals.

24. An integrated ultra wideband transceiver, comprising:
a transmitter;
a receiver;
a first on-chip monopole antenna electrically connected to the transmitter for transmitting electrical signals, and a second on-chip monopole antenna electrically connected to the receiver for receiving electrical signals;
a clock generator;
a baseband controller electrically connected to, and configured to exert a measure of control over, at least one of the transmitter, receiver, or clock generator;
a micro-battery operative to provide operating power to each of the transmitter, receiver, clock generator, and baseband controller;
a current limiter electrically connected between the micro-battery and at least one of the transmitter, receiver, clock generator, or baseband controller; and
an on-chip storage capacitor electrically connected to the current limiter and the at least one of the transmitter, receiver, clock generator, or baseband controller,
wherein the baseband controller is configured to control a duty cycle of the receiver at a frequency that is faster than a bit rate at which the receiver receives data, and such that the receiver is in an active state of operation for only a portion of each bit cycle corresponding to the bit rate, and further wherein the portion of each bit cycle that the receiver is active is less than the entirety of the bit cycle.

25. The transceiver of claim 20, wherein the clock generator comprises a temperature-compensated relaxation oscillator.

26. The transceiver of claim 24, wherein the clock generator comprises a temperature-compensated relaxation oscillator.

* * * * *